United States Patent [19]

Ballonoff

[11] 3,913,216

[45] Oct. 21, 1975

[54] METHOD FOR FABRICATING A PRECISION ALIGNED SEMICONDUCTOR ARRAY

[75] Inventor: Aaron Ballonoff, Sunnyvale, Calif.

[73] Assignees: Signetics Corporation, Sunnyvale; Watkins-Johnson Company, Palo Alto, both of Calif. ; part interest to each

[22] Filed: June 20, 1973

[21] Appl. No.: 371,743

[52] U.S. Cl. .......... 29/580; 29/589

[51] Int. Cl.² .......... B01J 17/00

[58] Field of Search .......... 29/583, 580, 589, 590, 29/591, 577, 576 B; 219/121 L, 121 LM

[56] References Cited

UNITED STATES PATENTS

| | | | |
|---|---|---|---|
| 3,360,398 | 12/1967 | Garibotti | 219/121 LM |
| 3,566,214 | 2/1971 | Usuda | 29/576 |
| 3,623,219 | 11/1971 | Stoller et al. | 29/580 |
| 3,634,927 | 1/1972 | Neale et al. | 219/121 LM |
| 3,657,611 | 4/1972 | Yoneda | 29/589 |
| 3,787,252 | 1/1974 | Filippazzi et al. | 29/580 |
| 3,820,236 | 6/1974 | Haitz | 29/583 |

*Primary Examiner*—Roy Lake
*Assistant Examiner*—Craig R. Feinberg
*Attorney, Agent, or Firm*—Flehr, Hohbach, Test, Albritton & Herbert

[57] ABSTRACT

A method for fabricating a precision aligned semiconductor array. In a specific embodiment, the method is applied to forming an array of semiconductor diodes useful as an electron bombarded semiconductor target. A wafer is fabricated with the semiconductor devices or circuits spaced on the wafer as they will be in the final array. After completion of fabrication of the devices the wafer has metallization formed on its back. The array is then bonded to metallized pads carried by an insulating substrate. After bonding the array to the substrate, a laser scriber removes a strip of material between adjacent devices so that there is no longer a continuous path of semiconductor between any two devices.

9 Claims, 3 Drawing Figures

METHOD FOR FABRICATING A PRECISION ALIGNED SEMICONDUCTOR ARRAY

BACKGROUND OF THE INVENTION

The invention described herein was made in the course of work under a grant or award from the U.S. Army.

This invention pertains to a method for forming a precision aligned semiconductor array.

Many applications require arrays of semiconductor devices or circuits which are precisely aligned with respect to one another. One such application, for example, is in the case of an electron bombarded semiconductor (EBS) target. In EBS applications, a semiconductor target comprising a plurality of reverse biased diodes is bombarded by an electron beam. In EBS applications it is necessary that the adjacent semiconductor devices (diodes in this case) be isolated from each other as well as very precisely aligned with respect to one another. An electron beam is swept across the diodes a very precise amount, and if it is necessary to sweep the electron beam more than anticipated, this costs power and results in a less efficient device. Also, in certain applications the diodes are connected in series. The spacing between diodes then becomes critical in that if there is a variation in spacing there will be a variation in output impedance of the series-connected diodes, so that it might not be possible to couple the semiconductor target into a load properly.

State of the art methods are available in which a semiconductor wafer is separated into individual dice with the die dimensions accurately controlled such as by sawing. Then, the individual dice can be aligned and bonded to a substrate. Such a technique is really not very precise because of the limitations to the precision with which a mechanical device can be stepped over the distance involved for bonding the individual semiconductor dice. This is particularly the case when applications require that the semiconductor dice be very close together, such as distances on the order of one or two mils for example. With that small a spacing between dice there is insufficient room to grip a semiconductor die properly and prevent it from sliding while it is bonded to a substrate.

OBJECTS AND SUMMARY OF THE INVENTION

Accordingly, it is an object of this invention to provide a method for fabricating precisely aligned arrays of semiconductor devices or circuits.

It is a more specific object of this invention to provide a method for fabricating precisely aligned arrays of semiconductor devices or circuits in which the individual devices or circuits are isolated from each other.

Briefly, in accordance with one embodiment of the invention, a plurality of semiconductor devices are formed in a single semiconductor substrate. The backside of the semiconductor substrate is metallized. An insulating substrate having a plurality of contact pads, one for each of the semiconductor devices, is provided. The metallized backside of the semiconductor substrate is bonded to the contact pads carried by the insulating substrate. A laser scriber then is used to remove a strip of the semiconductor substrate between each of the adjacent semiconductor devices so that there is no longer a continuous path of semiconductor material between any two devices.

DESCRIPTION OF THE PREFERRED EMBODIMENTS

Figure 1:
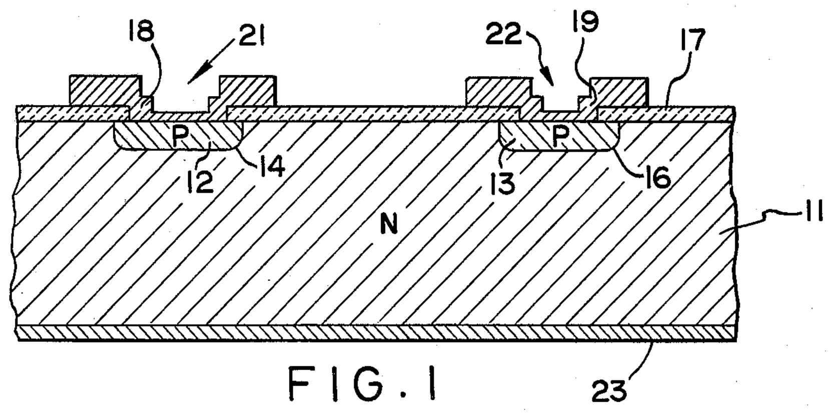
FIG. 1 is a cross-section of a portion of a semiconductor substrate and illustrating formation of two diodes therein.

It is known in the art that a plurality of semiconductor devices or circuits can be formed in a single semiconductor wafer through the use of conventional photolithographic techniques, in which the orientation and spacing of the semiconductor devices or circuits with respect to one another is very precise. FIG. 1 is a cross-section of a portion of a semiconductor wafer in which two adjacent P-N junction diodes have been formed and which is intended for use as an electron bombarded semiconductor device. Thus, in FIG. 1 a semiconductor substrate 11 which may be N-type silicon, for example, has regions 12 and 13 of an opposite type conductivity (P-type) suitably formed therein by means such as diffusion. There is thus defined P-N junctions 14 and 16. A layer of passivating material 17 is disposed on the top surface of the semiconductor substrate 11 overlying portions of the P-N junctions 14 and 16 which extend up to the top surface and also overlying the periphery of the semiconductor substrate 11 surrounding the P-N junctions. Metallization 18 is disposed directly on the top surface of the semiconductor substrate 11 overlying an inner area of the P-type region 12 and serving as an electrical contact means thereto. Metallization 18 also includes relatively thicker portions of metallization extending outwardly from the P-type region 12 and overlying portions of the layer 17. There is thus formed a P-N junction diode generally indicated by reference numeral 21.

In a similar manner, the P-type region 19 has metallization 19 directly contacting an inner area thereof to serve as an electrical contact thereto, and may include relatively thicker portions of metallization 19 overlying portions of the passivating layer 17 surrounding the periphery of the P-N junction 16. An additional P-N junction diode generally indicated by reference numeral 22 is thus formed.

Thereafter, in accordance with one embodiment, the entire semiconductor wafer or substrate 11 has a metallization layer 23 applied to the backside thereof. This metallization may comprise gold, for example.

Figure 2:
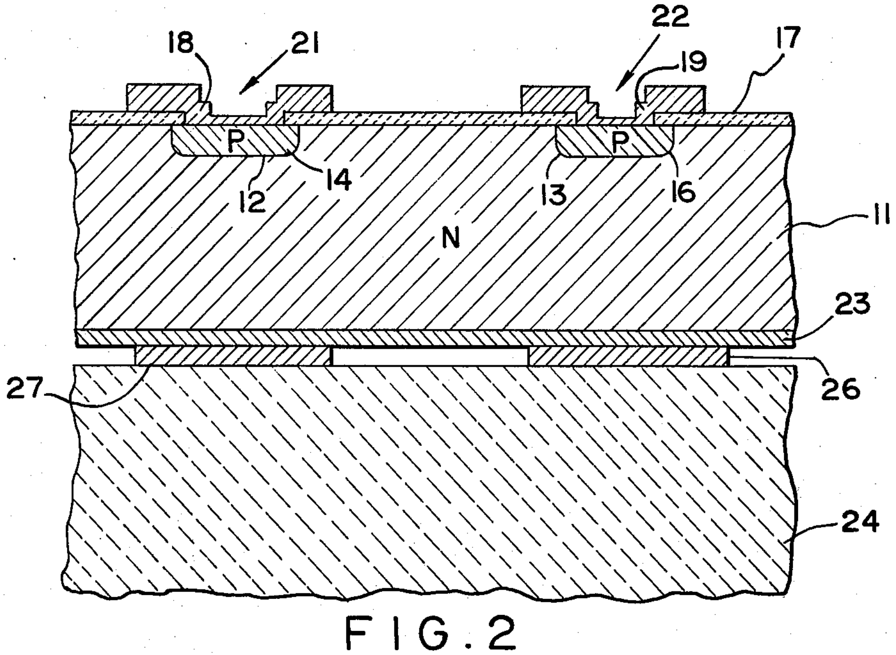
FIG. 2 is a cross-sectional view illustrating the manner in which a metallized back surface of the semiconductor substrate of FIG. 1 is bonded to contact pads carried by an insulating substrate.

Turning now to FIG. 2, the manner in which the semi-conductor substrate 11 with the P-N junction diodes 21 and 22 formed therein is attached to an insulating substrate 24 as illustrated. The insulating substrate 24 can be of any suitable materials, such as beryllia and can be of whatever geometric configuration is desired. A plurality of bonding pads are formed in spaced relationship on the insulating substrate 24 and two of these bonding pads 26 and 27 are illustrated in FIG. 2. The bonding pads may comprise gold metallization, for example, and are spaced on the beryllia substrate 24 in a manner corresponding to the spacing of the semiconductor devices (in this case the P-N junction diodes 21 and 22) in the semiconductor substrate 11. The semiconductor substrate 11 is then attached to the bonding pads carried by the insulating substrate 24 by bonding the metallized layer 23 on the backside of the semiconductor substrate 11 to the bonding pads carried by the insulating substrate 24. Such bonding can be effected by any suitable means such as by scrubbing the metallization together with a preform as known to those skilled in the art. Alternatively, a gold-germanium preform may be utilized between the gold metallization on the semiconductor substrate and insulating substrate. Upon the application of heat the preform melts, wetting the metallization on the two substrates and forming a bond therebetween. As shown in FIG. 2 the semiconductor substrate 11 is attached to the bonding pads on the substrate 24 in a manner such that each of the bonding pads underlies one of the semiconductor devices formed in the substrate 11. Thus, in FIG. 2 the bonding pad 26 underlies and is generally aligned with the P-N junction diode 22, and the bnding pad 27 underlies and is generally aligned with the P-N junction diode 21.

In accordance with another embodiment of the invention, instead of forming a layer of metallization on the entire backside of the semiconductor substrate, bonding pads are formed instead. In accordance with this technique, a bonding pad is formed on the backside of the semiconductor substrate underlying and generally aligned with each of the semiconductor devices formed in the substrate. These bonding pads (which may be gold, for example) are then aligned with and bonded to the corresponding bonding pads on the insulating substrate. Proper alignment of the bonding pads on the backside of the semiconductor substrate with the semiconductor devices formed in the front side of the semiconductor substrate can be achieved in several ways, including for example, passing infrared light through the substrate (infrared light will penetrate through the substrate) from its front side so that an image of the semiconductor devices is formed on its backside.

Figure 3:
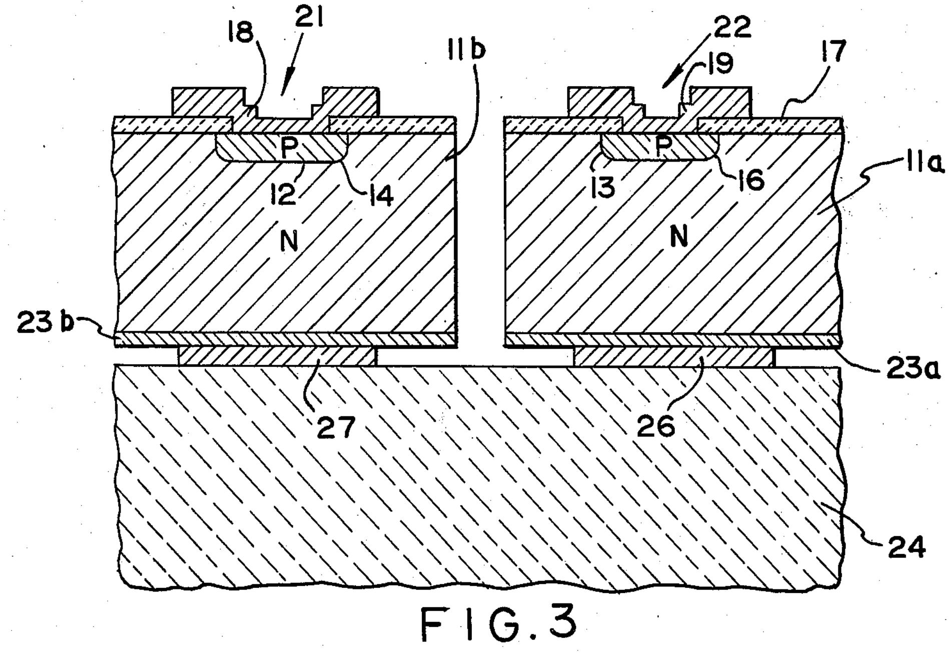
FIG. 3 is a cross-sectional view of the structure of FIG. 2 after a laser scriber has been used to remove a strip of the semiconductor substrate between the two adjacent diodes.

After the semiconductor substrate or wafer 11 has been attached to the bonding pads carried by the insulating substrate 24, then a strip of the semiconductor substrate between adjacent of the semiconductor devices is removed through the use of a laser scriber. During laser scribing the laser does not appreciably scribe the berryllia substrate. FIG. 3 is a cross-section of FIG. 2 after the laser scribing has been accomplished. Laser scribers are well known in the art. Such laser scribers may be optically aligned and the indexing of the laser scriber may be accurately controlled and changed. Using one of these laser scribers, a strip of the semiconductor substrate 11 is removed between each of the adjacent semiconductor devices or circuits. Thus, in accordance with the specific embodiment being discussed herein the semiconductor substrate 11 is separated into individual portions 11a having a metallized back surface **23*a* bonded to the bonding pad 26 and an entirely separate portion 11*b* having a metallized back surface 23*b* joined or bonded to the bonding pad 27. The width of the scribed line or the strip of the substrate 11 which is removed can be varied. Typically the scribed line or width of strip removed is something on the order of 3 mils. Thus as shown in FIG. 3 the separate semiconductor devices which in this instance are semiconductor P-N junction diodes 21 and 23** are completely isolated by having an air space between them. The alignment of the individual isolated semiconductor devices is thus very precise since it is the same alignment and orientation as when the semiconductor devices were initially formed in the semiconductor substrate. As mentioned before, this can be done by utilizing photolithographic techniques, so that very precise orientation and alignment between the plurality of semiconductor devices results. Following the method of this invention the separate devices or circuits formed in the semiconductor substrate are isolated one from the other and are bonded to an insulating substrate while preserving this original alignment.

The strip of semiconductor substrate separating individual of the semiconductor devices can also be removed by the use of chemical etching rather than laser scribing. Laser scribing is, however, the preferred method in that sometime in chemical etching the masking protection for the semiconductor devices (diode in this instance) breaks down and some of the semiconductor devices themselves are etched, ruining them. With the laser scribing, on the other hand, virtually no semiconductor devices are rendered defective during the process of laser scribing. Laser scribing is thus very quick, involves far less in the way of preparation of the substrate, and is far more reliable than chemical etching. In addition, in chemical etching a strip of material is removed that is as wide as it is deep. In laser scribing, on the other hand, the strip of material removed can be quite narrow while being as deep as required.

Thus, what has been described is a method for forming a precision aligned array of semiconductor devices on an insulating substrate. The process is discussed and illustrated herein with respect to two adjacent P-N junction diodes but is obviously applicable to arrays of substantially more than two diodes in which strips of the semiconductor substrate are removed between all of the adjacent diodes. The technique is also obviously applicable to any application in which a precisely aligned array of semiconductor devices or circuits other than diodes is required.

I claim:

1. A method for forming a precision aligned array of spaced semiconductor devices from a single substrate comprising the steps of forming a plurality of the semiconductor devices in the front side of a single semiconductor substrate, forming metallization on the backside of the semiconductor substrate, separately forming a plurality of metallized bonding pads on an insulating substrate, said semiconductor substrate being isolated from this separate formation step, bonding the metallized back surface of the semiconductor substrate to the bonding pads carried by the insulating substrate, and removing a strip of the semiconductor substrate extending from its front side between each of the adjacent plurality of semiconductor devices through to its backside and removing selected portions of said backside metallization simultaneous with the removal of said strip of substrate so that a plurality of semiconductor devices are formed with each individual device being carried by the insulating substrate and with adjacent devices being physically spaced from one another and completely electrically isolated from one another while preserving their original alignment with respect to one another.

2. A method in accordance with claim 1 wherein the metallization formed on the backside of the semiconductor substrate is formed in separate bonding pads, one for each of the semi-conductor devices with each bonding pad being generally aligned with one of the semiconductor devices.

3. A method in accordance with claim 1 wherein the strips of semiconductor substrate between each of the adjacent semi-conductor devices are removed by chemically etching through the semiconductor substrate.

4. A method in accordance with claim 1 wherein the strips of semiconductor substrate between adjacent of the semiconductor devices are removed by laser scribing.

5. A method in accordance with claim 1 wherein the steps of forming semiconductor devices in the semiconductor substrate comprises forming a plurality of P-N junction diodes in the semiconductor substrate for use as an electron bombarded semiconductor.

6. A method in accordance with claim 1 wherein the metallization on the backside of the semiconductor substrate is formed of gold and wherein the contact pads formed on the insultaing substrate are formed of gold.

7. A method for forming a precision aligned array of spaced semiconductor devices from a single substrate comprising the steps of forming a plurality of the semiconductor devices in the front side of a single semiconductor substrate, forming a continuous layer metallization on the backside of the semiconductor substrate, separately forming a plurality of metallized bonding pads on an insulating substrate, said semiconductor substrate being isolated from this separate formation step, bonding the metallized back surface of the semiconductor substrate to the bonding pads carried by the insulating substrate, and removing a strip of the semiconductor substrate extending from its front side between each of the adjacent plurality of semiconductor devices through to its backside and removing a strip of said backside metallization simultaneous with the removal of said strip of substrate so that a plurality of semiconductor devices are formed with each individual device being carried by the insulating substrate and with adjacent devices being physically spaced from one another and completely electrically isolated from one another while preserving their original alignment with respect to one another.

8. A method in accordance with claim 7 wherein the bonding pads are formed on a beryllia insulating substrate so that during laser scribing the laser does not appreciably scribe the beryllia substrate.

9. A method as in claim 1 wherein the metallization is formed on the backside of the semiconductor substrate in a predetermined patterned layer across the backside and a strip of said backside metallization is removed simultaneously with the step of removing a strip of the semiconductor substrate.

* * * * *